(12) United States Patent
Chang et al.

(10) Patent No.: US 10,600,793 B2
(45) Date of Patent: Mar. 24, 2020

(54) FABRICATING MEMORY DEVICES WITH OPTIMIZED GATE OXIDE THICKNESS

(71) Applicant: Marvell World Trade Ltd., St. Michael (BB)

(72) Inventors: Runzi Chang, San Jose, CA (US); Winston Lee, Palo Alto, CA (US); Peter Lee, Pleasanton, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 16/397,943

(22) Filed: Apr. 29, 2019

(65) Prior Publication Data

US 2019/0259768 A1 Aug. 22, 2019

Related U.S. Application Data

(62) Division of application No. 15/799,776, filed on Oct. 31, 2017, now Pat. No. 10,319,727.

(Continued)

(51) Int. Cl.
*H01L 27/112* (2006.01)
*G11C 17/16* (2006.01)
(Continued)

(52) U.S. Cl.
CPC ...... *H01L 27/11206* (2013.01); *G11C 17/165* (2013.01); *G11C 17/18* (2013.01);
(Continued)

(58) Field of Classification Search
CPC ........... H01L 27/11206; H01L 23/5252; H01L 29/42364; H01L 27/115; H01L 21/823462; H01L 27/1052; G11C 17/165
See application file for complete search history.

(56) References Cited

U.S. PATENT DOCUMENTS 6,620,679 B1 * 9/2003 Tzeng ............... H01L 27/10873
257/E21.654
10,319,727 B2 6/2019 Chang et al.
(Continued)

FOREIGN PATENT DOCUMENTS

CN 102332454 1/2012
CN 103681684 3/2014
(Continued)

OTHER PUBLICATIONS

"Foreign Office Action", Taiwanese Application No. 106137222, dated Sep. 9, 2019, 5 pages.
(Continued)

*Primary Examiner* — Charles D Garber
*Assistant Examiner* — Alia Sabur

(57) ABSTRACT

The present disclosure describes apparatuses and methods for manufacturing programmable memory devices with optimized gate oxide thickness. In some aspects, lithography masks are used to fabricate oxide gates for programmable memory devices of an integrated-circuit (IC) die that are thinner than oxide gates fabricated for processor core devices of the IC die. In other aspects, lithography masks are used to fabricate oxide gates for the programmable memory devices of the IC die such that they are thicker than the oxide gates fabricated for the processor core devices of the IC die. By so doing, the programmable memory devices can be manufactured with optimized gate oxide thickness that may reduce programming voltage or increase device reliability of the programmable memory devices.

20 Claims, 7 Drawing Sheets

Related U.S. Application Data

(60) Provisional application No. 62/415,145, filed on Oct. 31, 2016.

(51) Int. Cl.
*G11C 17/18* (2006.01)
*H01L 21/311* (2006.01)
*H01L 23/525* (2006.01)
*H01L 29/423* (2006.01)
*H01L 21/02* (2006.01)
*H01L 21/027* (2006.01)

(52) U.S. Cl.
CPC .... *H01L 21/0274* (2013.01); *H01L 21/02164* (2013.01); *H01L 21/02271* (2013.01); *H01L 21/31111* (2013.01); *H01L 23/5252* (2013.01); *H01L 29/42364* (2013.01); *H01L 21/0214* (2013.01); *H01L 21/0217* (2013.01)

(56) References Cited

U.S. PATENT DOCUMENTS

| | | | | |
|---|---|---|---|---|
| 2008/0079050 A1* | 4/2008 | Tzeng | ............... | H01L 27/10894 257/306 |
| 2009/0250726 A1* | 10/2009 | Kurjanowicz | ...... | H01L 23/5252 257/209 |
| 2011/0057252 A1 | 3/2011 | Park | | |
| 2011/0156157 A1* | 6/2011 | Milani | ............ | H01L 21/823857 257/369 |
| 2014/0073126 A1* | 3/2014 | Shen | ............... | H01L 21/823456 438/591 |
| 2016/0308064 A1 | 10/2016 | Shimabukuro | | |
| 2018/0122815 A1 | 5/2018 | Chang et al. | | |

FOREIGN PATENT DOCUMENTS

| | | |
|---|---|---|
| JP | 2016139696 | 8/2016 |
| TW | 201523709 | 6/2015 |
| TW | 201533854 | 9/2015 |
| WO | 2016147316 | 9/2016 |

OTHER PUBLICATIONS

"Notice of Allowance", U.S. Appl. No. 15/799,776, dated Jan. 24, 2019, 8 pages.

"Restriction Requirement", U.S. Appl. No. 15/799,776, dated Aug. 29, 2018, 8 pages.

\* cited by examiner

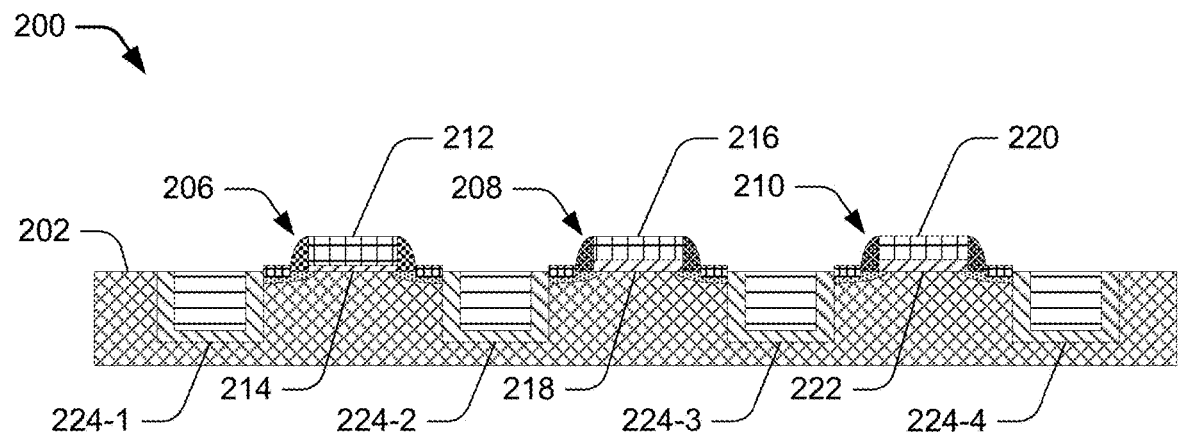
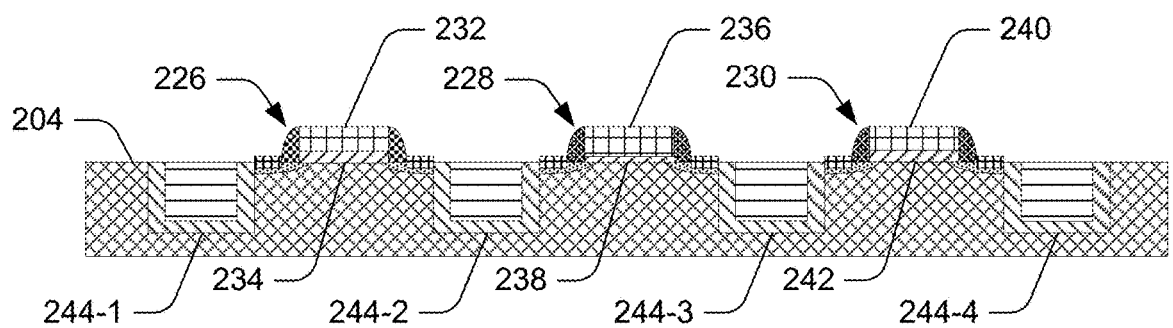
Fig. 2

500

```
┌─────────────────────────────────────────────┐
│ Expose gate areas of programmable memory    │
│ devices and processor core devices and      │
│ occlude gate areas of I/O devices           │
│ 502                                         │
└─────────────────────────────────────────────┘
                    ↓
┌─────────────────────────────────────────────┐
│ Etch, from the exposed gate areas of the    │
│ programmable memory devices and the         │
│ processor core devices, a first layer of    │
│ oxide material                              │
│ 504                                         │
└─────────────────────────────────────────────┘
                    ↓
┌─────────────────────────────────────────────┐
│ Form a second layer of oxide material       │
│ covering the respective gate areas of the   │
│ programmable memory devices, the processor  │
│ core devices, and the I/O devices           │
│ 506                                         │
└─────────────────────────────────────────────┘
                    ↓
┌─────────────────────────────────────────────┐
│ Expose the gate areas of the processor core │
│ devices and occlude the respective gate     │
│ areas of the programmable memory devices    │
│ and the I/O devices                         │
│ 508                                         │
└─────────────────────────────────────────────┘
                    ↓
┌─────────────────────────────────────────────┐
│ Etch, from the exposed gate areas of the    │
│ processor core devices, the second layer    │
│ of oxide material                           │
│ 510                                         │
└─────────────────────────────────────────────┘
                    ↓
┌─────────────────────────────────────────────┐
│ Form a third layer of oxide material        │
│ covering the respective gate areas of the   │
│ programmable memory devices, the processor  │
│ core devices, and the I/O devices           │
│ 512                                         │
└─────────────────────────────────────────────┘
```

Fig. 5

FABRICATING MEMORY DEVICES WITH OPTIMIZED GATE OXIDE THICKNESS

CROSS REFERENCE TO RELATED APPLICATION

This application is a divisional of and claims priority to U.S. patent application Ser. No. 15/799,776, filed Oct. 31, 2017, which in turn claims priority to U.S. Provisional Patent Application Ser. No. 62/415,145, filed Oct. 31, 2016, the disclosures of which are incorporated by reference herein in their entirety.

BACKGROUND

Conventional techniques for fabricating an integrated-circuit (IC) die rely on a single lithography cycle to pattern oxide gates of device transistors of the IC die. This results in device transistors of the IC die having oxide gates with a similar thickness, which governs device functionality and performance over a particular voltage range. In some cases, however, the device transistors of the IC die are configured to support multiple types of devices that operate at different respective voltage levels, such as memory devices, processor core devices, input/output (I/O) devices, and the like. To ensure correct operation of the multiple types of device transistors at different respective voltage levels, IC dies often include additional circuitry for voltage regulation or isolation to prevent lower-voltage transistor devices from being damaged by high voltage signals of other device types. The addition of this regulation and protection circuitry, however, can be expensive in terms of power, circuit complexity, or design space of an IC die.

SUMMARY

This summary is provided to introduce subject matter that is further described in the Detailed Description and Drawings. Accordingly, this Summary should not be considered to describe essential features nor used to limit the scope of the claimed subject matter.

In some aspects, a method is described that exposes respective gate areas of programmable memory devices and processor core devices of an IC die and occludes gate areas of I/O devices of the IC die. After etching a first layer of oxide material from the exposed respective gate areas of the programmable memory devices and the processor core devices, a second layer of oxide material is formed on the IC die. Gate areas of the programmable memory devices are then exposed and respective gate areas of the processor core devices and the I/O devices are occluded. The method then etches the second layer of oxide material from the exposed gate areas of the programmable memory devices, after which a third layer of oxide material is formed on the IC die. This can be effective to fabricate, on the IC die, a thinner oxide gate for the programmable memory devices than that of the processor core devices.

In other aspects, a method is described that exposes respective gate areas of programmable memory devices and processor core devices of an IC die and occludes gate areas of I/O devices of the IC die. After etching a first layer of oxide material from the exposed respective gate areas of the programmable memory devices and the processor core devices, a second layer of oxide material is formed on the IC die. Gate areas of the processor core devices are then exposed and the respective gate areas of the programmable memory devices and the I/O devices are occluded. The method then etches the second layer of oxide material from the exposed gate areas of the processor core devices, after which a third layer of oxide material is formed on the IC die. This can be effective to fabricate, on the IC die, a thicker oxide gate for the programmable memory devices than that of the processor core devices.

In other aspects, an IC die is described that comprises I/O devices having oxide gates of a first thickness, processor core devices having oxide gates of a second thickness, and non-volatile programmable memory devices having oxide gates of a third thickness. The third thickness of the oxide gates of the non-volatile memory devices may be different from the first thickness of the oxide gates of the I/O devices and the second thickness of the oxide gates of the processor core devices. The IC die also includes a memory device programming circuit that is configured to program the non-volatile memory devices by altering respective oxide gates of the non-volatile memory devices using a programming voltage that is approximately twice a voltage at which the processor core devices operate.

The details of one or more implementations are set forth in the accompanying drawings and the following description. Other features and advantages will be apparent from the description and drawings, and from the claims.

BRIEF DESCRIPTION OF THE DRAWINGS

The details of one or more aspects of fabricating memory devices with optimized gate oxide thickness are described below. The use of the same reference numbers in different instances in the description and the figures may indicate like elements:

FIG. 2 illustrates example cross sections of IC dies in accordance with one or more aspects.

FIG. 5 illustrates an example method for fabricating oxide gates of programmable memory devices that are thicker that other oxide gates of an IC die.

DETAILED DESCRIPTION

Figure 1:
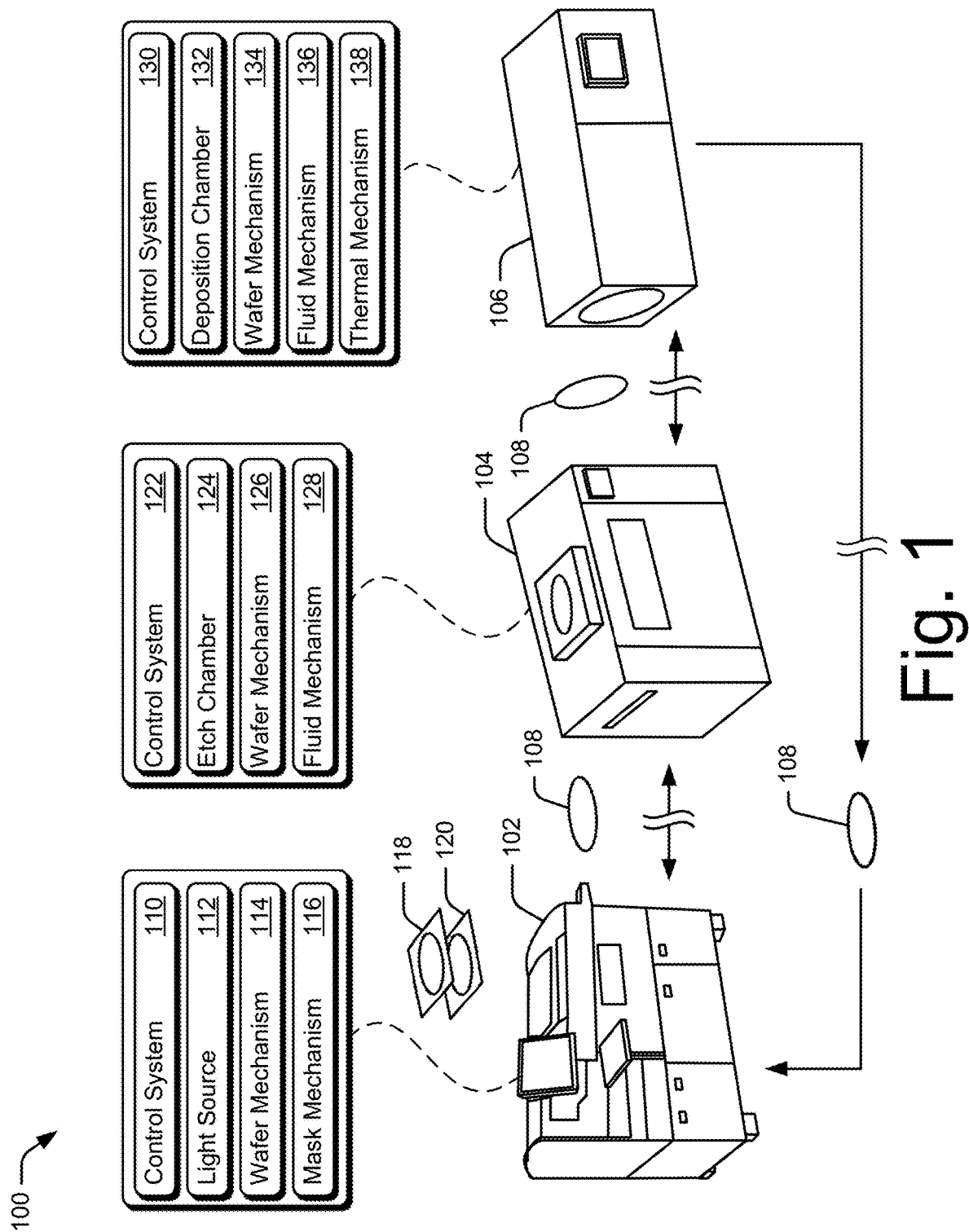
FIG. 1 illustrates an example operating environment that includes semiconductor manufacturing tools for fabricating an IC die.

Conventional techniques of integrated-circuit (IC) die fabrication typically rely on a single lithography cycle to pattern oxide gates of transistors that are configured as multiple types of devices. This results in oxide gates of the multiple types of devices being a same thickness, which leads to design issues and other challenges because each type of device often has different respective operational or performance requirements. For example, transistors of an IC die may be implemented as memory devices, processor core devices, and input/output (I/O) devices, all of which have different operational parameters. These different operational parameters may include operating voltages at which some transistors (e.g., processor core devices) of the IC switch or programming voltages for physically altering gate structure of other transistors (e.g., memory devices) of the IC.

In particular, the process for programming a programmable memory device often requires applying a programming voltage to physically break down the oxide gate of the programmable memory device (e.g., an electronic anti-fuse) in order to create a conductive path that is effective to "set" a bit of the device. When the programmable memory device has an gate oxide thickness that is the same as processor core devices of the IC die, the programming voltage used to break down the oxide gate of the programmable memory device can be a factor of three to four times higher than that of the voltage at which the processor core device functions. Accommodating such a high programming voltage within the IC die typically involves special design considerations to mitigate voltage stress on other structures of the IC die. Additionally, generating a programming voltage that is three to four times higher than other operating voltages of the IC die may require charge pump circuitry, designated external power voltage supplies, additional printed circuit board traces, or dedicated SoC component pins to bring the higher programming voltage into the IC die.

This disclosure describes apparatuses and techniques for fabricating memory devices with optimized gate oxide thickness. In some aspects, one or more lithography masks are used to fabricate oxide gates for programmable memory devices of an integrated-circuit (IC) die that are thinner than oxide gates fabricated for processor core devices of the IC die. In other aspects, one or more lithography masks are used to fabricate the oxide gates for the programmable memory devices of the IC die such that they are thicker than the oxide gates fabricated for the processor core devices of the IC die. By so doing, the programmable memory devices can be manufactured with optimized gate oxide thickness that may reduce programming voltage or increase device reliability of the programmable memory devices.

These and other aspects described herein may be implemented to fabricate, with multiple lithography cycles, an IC die with multiple devices types with oxide gates of different respective thicknesses. In some cases, oxide gates of programmable memory devices, such as one-time programmable (OTP) memory or multiple-time programmable (MTP) memory, are formed with a thickness optimized for lower programming voltage or reduced gate leakage. Alternately or additionally, one of the multiple lithography cycles may be used to optimize other surface topography of the programmable memory device, such as the oxide gate interface, in order to enhance programming characteristics.

The following discussion describes an operating environment, techniques that may be employed in the operating environment, and a System-on-Chip (SoC) in which components of the operating environment can be embodied. In the context of the present disclosure, reference is made to the operating environment by way of example only.

Operating Environment

FIG. 1 illustrates an example operating environment 100 that includes a lithography tool 102, an etch tool 104, and a deposition tool 106 in accordance with one or more aspects. Generally, these tools process a semiconductor wafer 108 to fabricate devices and circuitry of integrated-circuits (ICs) on the semiconductor wafer 108. After patterning and fabrication, the semiconductor wafer 108 can be cut or singulated into individual IC dies for incorporation into any suitable type of component, such as a System-on-Chip (SoC) component, an Application-Specific Integrated-Circuit (ASIC) component, a System-in-Package (SIP) component, a memory component, a microprocessor component, and the like.

Generally, the lithography tool 102 includes mechanisms and controls for patterning a layer of photoresist material on the semiconductor wafer 108. In some cases, the lithography tool 102 is configurable to alter or modify a layer of the photoresist material on the semiconductor wafer 108 in a predefined pattern. In this example, the lithography tool 102 includes a control system 110, light source 112, wafer mechanism 114, and mask mechanism 116 for implementing lithography operations. The control system 110 is configured to establish and maintain parameters for patterning the layer of photoresist material, such as light radiation intensity, light radiation exposure time, and alignment of the semiconductor wafer 108 relative to masks 118, 120 via the wafer mechanism 114 or the mask mechanism 116. A hardware-based processor (not shown) of the lithography tool 102 may execute processor-executable instructions from a memory device to implement the control system 110 or a user interface associated therewith. To pattern the layer of photoresist material, the light source 112 (or an energy source) radiates, through the mask, any suitable type of light or radiation, such as ultraviolet (UV) light, extreme ultraviolet (EUV) light, x-ray radiation, ion beams, and the like.

In the context of the operating environment 100, the lithography tool 102 is configured as part of a semiconductor wafer processing line in which the lithography tool 102 receives and processes the semiconductor wafer 108 as a work in process (WIP) semiconductor wafer towards a final product. The semiconductor wafer 108 includes multiple layers of semiconductor materials that can be processed to fabricate a plurality of like IC die on the semiconductor wafer 108. Typically, the lithography tool 102 receives the semiconductor wafer 108 coated with a layer of photoresist material. In such cases, the layer of photoresist material may cover a most-recently deposited layer of semiconductor material from which features of the IC die are to be fabricated.

The deposited layer of semiconductor material may include any suitable type of material, such as a dielectric or conductive material having an electrical or physical property configured to provide necessary electrical or physical performance attributes of features to being fabricated on the IC die. In order to pattern the layer of photoresist material over the layer of semiconductor material, light (or energy) is radiated from the light source 112 through a mask that is configured to permit irradiation of some portions of the layer of photoresist material while preventing irradiation of other portions of the layer of photoresist material. As illustrated in FIG. 1, multiple masks 118, 120 are available, each mask for a particular lithography cycle or features set. By way of example, a first mask 118 can create a particular pattern to fabricate a first set of features on the semiconductor wafer 108 during a first lithography cycle and a second mask 120 can create another pattern to fabricate a second set of features on the semiconductor wafer 108 during a second lithography cycle.

After the light source 112 radiates light through the one of the masks 118, 120 to pattern a layer of the photoresist material covering the layer of semiconductor material, the semiconductor wafer 108 is developed on a developing tool (not shown) to remove undesired photo resist and expose portions of the layer of semiconductor material for further processing. A positive photoresist material may be used, in which case portions of irradiated portions of photoresist material become soluble when developed and are removed using a developer solution. Alternatively, a negative photoresist material may be used, in which case portions of photoresist material that are not irradiated become soluble when developed and are removed using a developer solution.

In this example, the etch tool 104 of the operating environment 100 is configured to receive and process the semiconductor wafer 108 after the semiconductor wafer has been developed. The etch tool 104 includes mechanisms and controls for removing, via an etch process, semiconductor materials from the surface of the semiconductor wafer 108. The etch tool 104 includes a control system 122, an etch chamber 124, a wafer mechanism 126, and a fluid mechanism 126 to implement various etching operations. The control system 122 establishes and maintains parameters for etching. In some cases, a hardware-based processor of the etch tool 104 executes processor-executable instructions from a memory device to implement the control system 122 or a user interface associated therewith. The etch chamber 124 is a chamber in which the semiconductor wafer 108 is positioned and exposed to an etchant fluid, such as a chemical liquid, plasma gas, and the like. The wafer mechanism 126 transports the semiconductor wafer 108 into and out of the etch chamber 124. To facilitate etching, the fluid mechanism 128 of the etch tool 104 disperses the etchant fluid into the chamber.

The semiconductor wafer 108, with portions of the layer of semiconductor material exposed according to the pattern dictated by either the mask 118 or the mask 120, is presented to the etch tool 104 for etching. During the etching process, the exposed portions of the layer of semiconductor material on the semiconductor wafer 108 (e.g., portions of the layer of semiconductor material not remaining coated by photoresist material after the semiconductor wafer 108 is developed) are removed. Unexposed portions of the layer of semiconductor material (e.g., portions of the layer of semiconductor material remaining coated by photoresist material after the semiconductor wafer 108 is developed) are protected and not removed. After etching, the semiconductor wafer 108 is presented to an ashing tool (not shown), where all remaining photoresist is removed from the semiconductor wafer 108.

The deposition tool 106 of the operating environment 100 is configured to receive the semiconductor wafer 108 after removal of the photoresist via the ashing tool. Generally, the deposition tool 106 includes mechanisms and controls for depositing a layer of semiconductor material on a semiconductor wafer. In this example, the deposition tool 106 includes a control system 130, a deposition chamber 132, a wafer mechanism 134, a fluid mechanism 136, and a thermal mechanism 138. The control system 130 establishes and maintains parameters for the deposition process, and may control the other components of the deposition tool 106 to implement various deposition operations. In some cases, a hardware-based processor (not shown) of the deposition tool 106 executes processor-executable instructions from a memory device to implement the control system 130 or a user interface associated therewith.

The deposition chamber 132 is a chamber in which the semiconductor wafer 108 is positioned via the wafer mechanism 134. In the deposition chamber 132, the semiconductor wafer 108 is exposed to environmental conditions (e.g., temperature and pressure) and materials effective to deposit the layer of the semiconductor material on the wafer. During the deposition process, the fluid mechanism typically introduces fluids into the chamber in a gaseous or chemical vapor form for deposit on the semiconductor wafer 108. The thermal mechanism 138 establishes and controls thermal and other environmental conditions, such as pressure, in the deposition chamber 132 during the deposition process. The deposition process can be implemented to form, in whole or part, any suitable type of semiconductor or device structure (e.g., transistors or diodes). In some cases, a layer of material that is deposited on the semiconductor wafer 108 has properties or is configured to provide transistor gate functionality for devices embodied on the semiconductor wafer. Such a layer of material can be, for example, a layer of a silicon oxynitride material, a layer of silicon dioxide material, or a layer of silicon nitride material.

In the context of the operating environment 100, the semiconductor wafer 108 is presented to the deposition tool 106 in order to deposit a new layer of semiconductor material. In some cases, the semiconductor wafer 108 is presented with portions of the previous layer of semiconductor material remaining. Depending on features being fabricated on the semiconductor wafer 108, the previous layer of semiconductor material may be a dielectric or conductive material having an electrical or physical property configured to provide necessary electrical or physical performance attributes for the features to being fabricated on the IC die. After the deposition of a new layer of semiconductor material using the deposition tool 106, another layer of photoresist material can be applied to the semiconductor wafer 108 using a coating tool (not shown) for additional patterning via an additional lithography cycle. These tools of the operating environment may be implemented to perform any suitable number of lithography, etching, or deposition operations in order to construct or define the devices embodied on the semiconductor wafer 108.

FIG. 2 illustrates cross sections of example IC die manufactured in accordance with one or more aspects generally at 200. In this example, a first IC die 202 includes devices with optimized oxide gate features that are thinner than oxide gates of other devices and a second IC die 204 includes devices with optimized oxide gate features that are thicker that oxide gates of other devices. In some aspects, the tools of operating environment 100 are used to provide various features, such as the optimized oxide gate features, of the IC dies 202 and 204. The implementation and use of these gate features vary, and are described throughout the disclosure.

As shown in FIG. 2, the IC die 202 includes features directed to transistor gate structures for multiple respective devices, which are configured as a programmable memory device 206, a processor core device 208, and an input/output (I/O) device 210. The programmable memory device 206 may be programmed through or using a metal gate 212 and an oxide gate 214, which in some cases may be broken down via programming voltage to form a conductive path through the programmable memory device 206. The processor core device 208 also includes features directed to transistor structures, including a metal gate 216 and an oxide gate 218 by which operation of the processor core device 208 is controlled. Similarly, the I/O device 210, which provides an interface or connectivity to circuitry external to the IC die, utilizes a transistor structure including a metal gate 220 and an oxide gate 222. Alternately or additionally, the IC die 202 may include non-transistor features, such as a shallow trench isolation (STI) features 224-1 through 224-4 to electrically isolate the devices from one another or other sections of the IC die.

In some aspects, the oxide gates 214, 218, and 222 of the IC die 202 are fabricated with the tools described with respect to FIG. 1. For example, the masks 118, 120 may be configured to fabricate the IC die 202 such that the programmable memory device oxide gate 214 is physically thinner than the processor core device oxide gate 218. To do so, the first mask 118 may be configured to expose radiated light to a portion of a layer of photoresist material that covers a gate area of the programmable memory device and also expose the radiated light a portion of the layer of photoresist material that covers a gate area of the processor core device. Also, as part of this configuration, the first mask 118 may occlude the radiated light from a portion of the layer of photoresist material that covers a gate area of an I/O device.

To provide the IC die 202, the second mask 120 may be configured to expose radiated light to a portion of a layer of photoresist material that covers the gate area of the programmable memory device. Also, as part of this configuration, the second mask may occlude the radiated light from a portion of the layer of photoresist material that covers the gate area the processor core device and also occlude the radiated light from a portion of the layer of photoresist material that covers the gate area of the I/O device. Performing two masking cycles with the masks 118, 120 configured as such may provide a programmable memory device oxide gate 214 that is physically thinner than a processor core device oxide gate 218. The thinner oxide gate 214 of the programmable memory device may enable the programmable memory device 206 to be programmed with a programming voltage (e.g., approximately two volts) that is lower than a programming voltage (e.g., approximately four volts) of conventionally implemented programmable memory devices.

As another example, consider the IC die 204 of FIG. 2 that includes transistor structures for multiple respective devices. Here, the transistors are configured as a programmable memory device 226, a processor core device 228, and an input/output (I/O) device 230. The programmable memory device 226 may be programmed through or using transistor features including a metal gate 232 and an oxide gate 234, which in some cases may be broken down via programming voltage to form a conductive path through the programmable memory device 226. The processor core device 228 may be controlled using a transistor that includes a metal gate 236 and an oxide gate 238. Similarly, a transistor of the I/O device 240, which provides an interface or connectivity to circuitry external to the IC die, can include a metal gate 230 and an oxide gate 242. Alternately or additionally, the IC die 204 may include non-transistor features, such as a shallow trench isolation (STI) features 244-1 through 244-4 to electrically isolate the devices from one another or other sections of the IC die.

In some aspects, the oxide gates 234, 238, and 242 of the IC die 204 are fabricated with the tools described with respect to FIG. 1. For example, the masks 118, 120 may be configured to fabricate the IC die 204 such that the programmable memory device oxide gate 234 is physically thicker than the processor core device oxide gate 238. To do so, the first 118 mask may be configured to expose radiated light to a portion of a layer of photoresist material that covers a gate area of the programmable memory device and also expose the radiated light to a portion of the layer of photoresist material that covers a gate area of the processor core device. Also, as part of this configuration, the first mask 118 may occlude the radiated light from a portion of the layer of photoresist material that covers a gate area of an I/O device.

To provide the IC die 204, the second mask 120 may be configured to expose radiated light to a portion of a layer of photoresist material that covers the gate area of the processor core device. Also, as part of this configuration, the second mask 120 may occlude the radiated light from a portion of the layer of photoresist material that covers the gate area the processor core device and also occlude the radiated light from a portion of the layer of photoresist material that covers the gate area of the I/O device. Performing two masking cycles with the masks 118, 120 configured as such may provide a programmable memory device with an oxide gate 234 being physically thicker than the processor core device oxide gate 238. The thicker oxide gate 234 of the programmable memory device 226 may reduce gate leakage of the programmable memory device.

Techniques for Optimizing Gate Oxide Thickness

The following discussion describes techniques for optimizing gate oxide thicknesses. In some cases, the techniques are implemented to optimize gate oxide thickness of programmable memory devices being fabricated on a semiconductor wafer, such as semiconductor wafer 108. These techniques can be implemented using any of the environments and entities described herein, such as the lithography tool 102, etch tool 104, deposition tool 106, and/or masks 118 and 120. These techniques include methods illustrated in FIGS. 3 and 5, each of which is shown as a set of operations performed by one or more entities. These methods are not necessarily limited to the orders of operations shown. Rather, any of the operations may be repeated, skipped, substituted, or re-ordered to implement various aspects described herein. Further, these methods may be used in conjunction with one another, in whole or in part, whether performed by the same entity, separate entities, or any combination thereof. In portions of the following discussion, reference will be made to operating environment 100 of FIG. 1 and entities of FIG. 2 by way of example. Such reference is not to be taken as limiting described aspects to operating environment 100 but rather as illustrative of one of a variety of examples.

Figure 3:
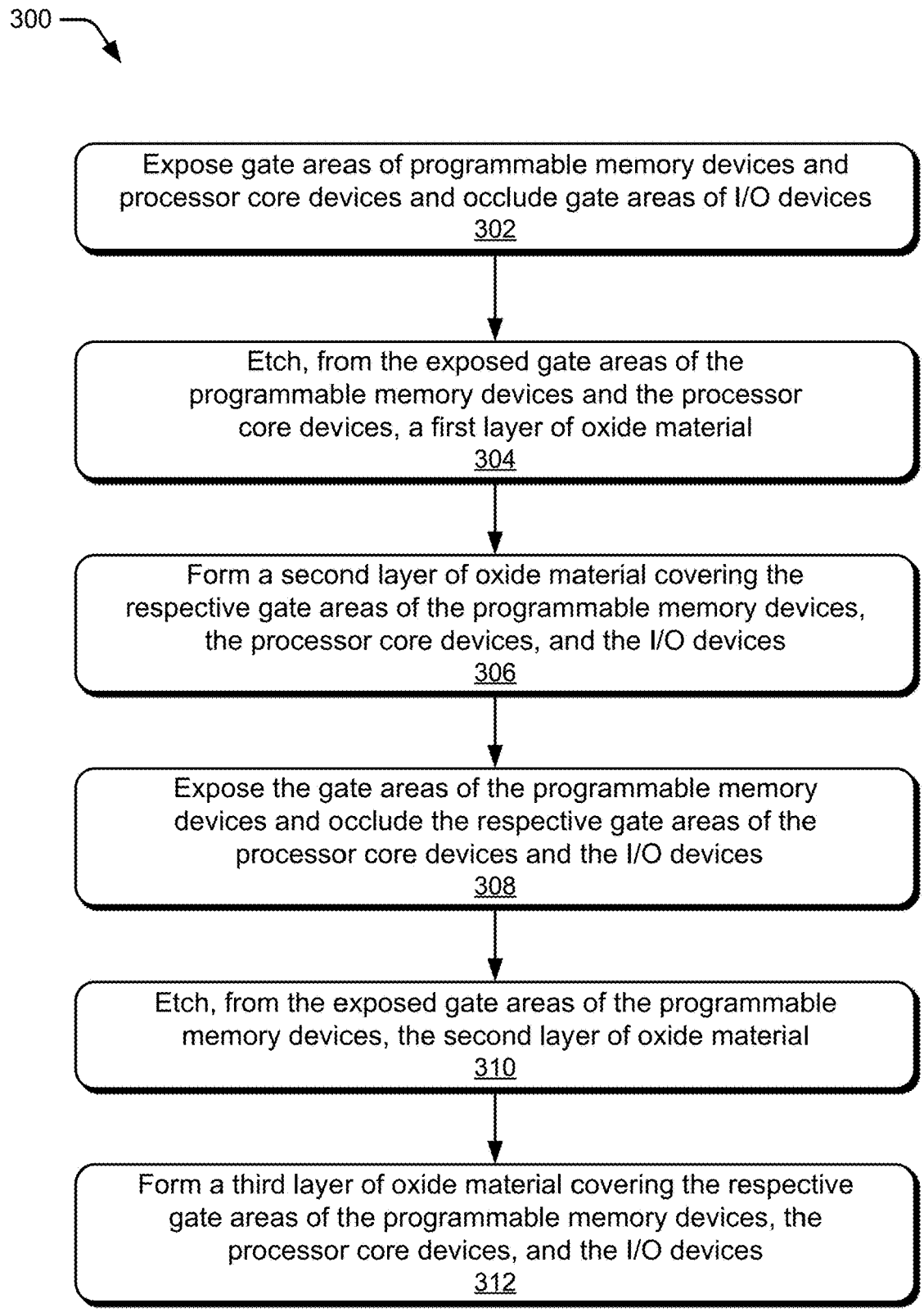
FIG. 3 illustrates an example method for fabricating oxide gates of programmable memory devices that are thinner than other oxide gates of an IC die.

FIG. 3 illustrates an example method 300 for fabricating oxide gates of programmable memory devices that are thinner than other oxide gates of an IC die, including operations performed by the lithography tool 102, etch tool 104, and deposition tool 106 of FIG. 1.

At 302, gate areas of programmable memory devices and processor devices of an IC die being fabricated on a semiconductor wafer are exposed and gate areas of I/O devices of the IC die are occluded. In some cases, a lithography mask is positioned relative the semiconductor wafer on which the IC die is embodied via a mask mechanism or wafer mechanism of a lithography tool. Generally, the semiconductor wafer includes a silicon substrate that is configured to provide respective features of the programmable memory devices, processor devices, and I/O devices for the IC die. The semiconductor wafer may also include a layer of oxide material and a layer of photoresist material over the layer of oxide material. Light or other energy radiated through the lithography mask may interact with exposed portions of the photoresist material, such as over the gate areas of the programmable memory devices and processor devices of the IC die. After being exposed to light or energy, the semiconductor wafer may then be developed to remove portions of photoresist material to enable etching respective portions of the underlying oxide material. It is also possible, at 302, for exposure and occlusion of areas to be performed using more than one lithography mask.

Figure 4:
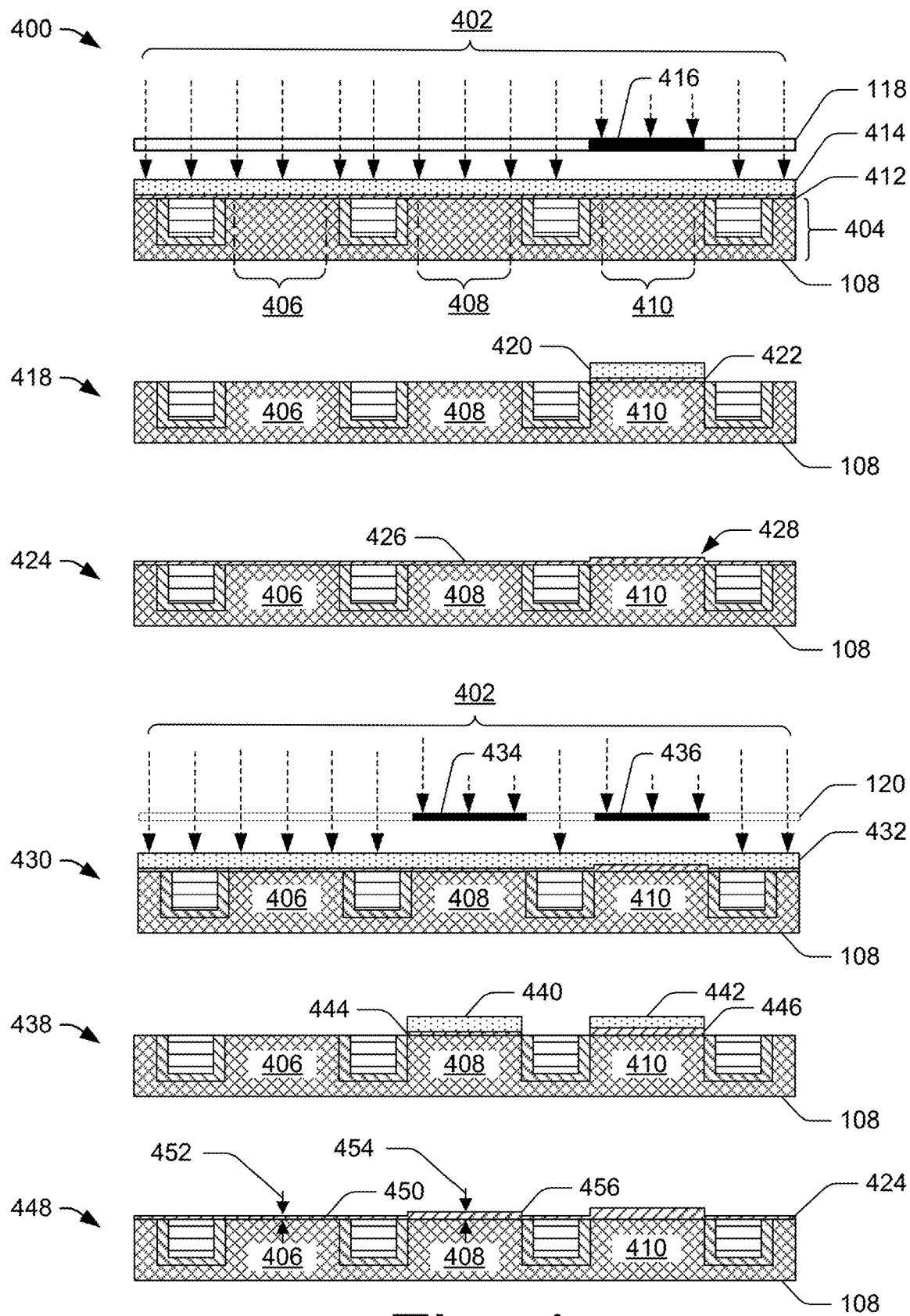
FIG. 4 illustrates example cross sections of an IC die fabricated to provide programmable memory device oxide gates that are thinner than other oxide gates of the IC die.

By way of example, consider FIG. 4 in which a semiconductor wafer is illustrated at various stages of fabrication. As shown at 400, the semiconductor wafer 108 is patterned using light 402 that is radiated from the light source 112 of the lithography tool 102. The semiconductor wafer 108 includes a silicon substrate 404 that is configured via previous fabrication processes to have one or more IC die, each IC die having at least a programmable memory device gate area 406, a processor core device gate area 408, and an I/O device gate area 410. Here, the semiconductor wafer 108 is received with a first layer of an oxide material 412 and a first layer of photoresist material 414. At the lithography tool 102, the semiconductor wafer 108 is positioned relative to the first mask 118. In this example, the first mask 118 is configured to allow the radiated light 402 to radiate through the first mask 118 and interact with portions of the first layer of photoresist material 414 covering at least the programmable memory device gate area 406 and processor core device gate area 408. The first mask 118 is also configured to prevent, via an opaque section 416, radiated light 402 from radiating through the first mask 118 to other portions of the first layer photoresist material 414, such as that covering the I/O device gate area 410.

As shown at 400, the opaque section 416 occludes (e.g., covers or blocks) the I/O device gate area 410 from the light source 112 and prevents the radiated light 402 from interacting with the first layer of photoresist material 414 that covers the I/O device gate area 410. After the semiconductor wafer 108 is patterned via the radiated light 402, the semiconductor wafer 108 is developed by a developing tool (not shown) to remove portions of the first layer of photoresist material 414. In some cases, the first layer of photoresist material 414 is positive in nature and, as the semiconductor wafer 108 is developed, portions of the first layer of photoresist material 414 that interacted with the radiated light 402 are dissolved by a developing solution and removed. In other cases, the first layer of photoresist material 414 is negative in nature and, as the semiconductor wafer 108 is developed, portions of the first layer of photoresist material 414 that did not interact with the radiated light 402 are dissolved by the developing solution and removed. In such cases, the pattern of the first mask 118 may be reversed from that shown in FIG. 4 such that the I/O device gate area 410 is exposed to the radiated light 402.

At 304, a first layer of oxide material is etched from exposed gate areas of the programmable memory devices and the processor core devices of the IC die. The oxide material is also etched from other portions of the IC die that are exposed by the removal of photoresist material. Generally, the oxide material can be etched from a semiconductor wafer on which the IC die is embodied using any suitable etchant fluid, such as a chemical liquid, plasma gas, and the like. Alternately or additionally, the semiconductor wafer can be presented to an ashing tool after etching, in which case photoresist remaining on the IC die may be removed.

Continuing the ongoing example and as shown at 418, the semiconductor wafer 108 is etched by the etch tool 104 to remove the portions of the first layer of oxide material 412 that were covered by the previously-exposed portions of the first layer of photoresist material 414. Here, 418 illustrates a state of the semiconductor wafer 108 that results from the first layer of photoresist material 414 being a positive photoresist material, the exposed portions of which were developed to permit the underlying oxide material to be etched from the surface of the wafer.

In contrast to the developed portions, a portion 420 of the first layer of photoresist material 414 that was not irradiated by the light 402 protects a respective portion 422 of the first layer of oxide material 412 covering the I/O device gate area 410 from being etched off the surface of the semiconductor wafer 108. As such, the portion 422 of the first layer of oxide material 412 remains on the semiconductor wafer 108 to form a base oxide layer over the I/O gate device area 410. After etching the unprotected portions of the first layer of oxide material 412 from the semiconductor wafer 108, an ashing tool removes remaining portions of the first layer of photoresist material 414 that were not irradiated, such as the portion 420 of the first layer of photoresist material 414 covering the I/O gate device area 410.

At 306, a second layer of oxide material covering the gate areas of the programmable memory devices, the processor core devices, and the I/O devices of the IC die is formed. This second layer of oxide material may be blanketly formed, deposited, or grown on the surface of the IC die. In the context of the present example and as shown at 424, a second layer of oxide material 426 is deposited by the deposition tool 106 onto the surface of the semiconductor wafer 108. Here, note that the second layer of oxide material 426 is thicker on the I/O gate device area 410 due to the second layer of oxide material 426 being formed at 428 on the remaining portion 422 of the first layer of oxide material 412.

At 308, gate areas of programmable memory devices of the IC die are exposed and gate areas of processor core devices and I/O devices of the IC die are occluded. In some cases, the one or more lithography masks are positioned relative to a semiconductor wafer on which the IC die is embodied via a mask mechanism or wafer mechanism of a lithography tool. The semiconductor wafer may also include a layer of oxide material and a layer of photoresist material over the oxide material. Light or other energy radiated through the one or more lithography masks may interact with exposed portions of the photoresist material, such as portions over the gate areas of the programmable memory devices of the IC die. After being exposed to light or energy, the semiconductor wafer may then be developed to remove portions of photoresist material to enable etching of respective portions of the underlying oxide material.

Continuing with the ongoing example and as shown at 430, the semiconductor wafer 108 is patterned with the light 402 radiated from the light source 112 of the lithography tool 102. Here, assume that the semiconductor wafer 108 is received with a second layer of photoresist material 432 that is applied by a coating tool (not shown) between states depicted at 424 and 430. At 430, the second mask 120 is configured to prevent radiated light 402 from radiating through opaque areas 434 and 436. The radiated light 402 interacts with portions of the second layer of photoresist material 432 covering the programmable memory device gate area 406 and does not interact with portions of the second layer of photoresist material 432 covering the processor core device gate area 408 or the I/O device gate area 410.

After stage 430, the semiconductor wafer 108 is developed on a developing tool (not shown) to remove portions of the second layer of photoresist material 432. In some cases, the second layer of photoresist material 432 is positive in nature and, as the semiconductor wafer 108 is developed, portions of the second layer of photoresist material 432 that interacted with the radiated light 402 are dissolved by a developing solution and removed. In other cases, the second layer of photoresist material 432 is negative in nature and, as the semiconductor wafer 108 is developed, portions of the second layer of photoresist material 432 that did not interact with the radiated light 402 are dissolved by the developing solution and removed. In such cases, the pattern of the second mask 120 may be reversed from that shown in FIG. 4 such that portions of the second layer of photoresist material 432 covering the device processor gate area 404 and the I/O device gate area 410 are exposed to the radiated light 402.

At 310, the second layer of oxide material is etched from the exposed gate areas of the programmable memory devices of IC die. The second layer of oxide material is also etched from other portions of the IC die that are exposed by the removal of the second layer of photoresist material. Generally, oxide material can be etched from the semiconductor wafer on which the IC die is embodied using any suitable etchant fluid, such as a chemical liquid, plasma gas, and the like. Alternately or additionally, the semiconductor wafer can be presented to an ashing tool after etching, in which instance photoresist remaining on the IC die may be removed.

In the context of the present example and as shown at 438, the semiconductor wafer 108 is etched by the etch tool 104. During etching at 438, the memory device gate area 406 is exposed while the processor core device gate area 408 and the I/O device gate area 410 are protected from the etching by respective portions 440, 442 of the second layer of photoresist material 432. Here, 438 illustrates a state of the semiconductor wafer that results from the second layer of photoresist material 432 being a positive photoresist material, the exposed portions of which were developed to permit the underlying oxide material to be etched from the surface of the wafer.

In contrast to the developed portions, portions 440, 442 of the second layer of photoresist material 432 that were not irradiated by the light 402 protect respective portions 444, 446 of the layers of oxide material covering the processor device gate area 408 and the I/O device gate area 410 from being etched off the semiconductor wafer 108. As such, these portions 444, 446 of the oxide material remain on the semiconductor wafer 108 to form, or increase a thickness of, oxide layers over the processor device gate area 408 and I/O device gate area 410. After etching the unprotected portions of the layer of oxide material 426 from the semiconductor wafer 108, an ashing tool removes remaining portions of the second layer of photoresist material 432 that were not irradiated, such as the portions 440, 442 of the second layer of photoresist material 432.

At 312, a third layer of oxide material covering the respective gate areas of the programmable memory devices, the processor core devices, and the I/O devices of the IC die is formed. This third layer of oxide material may be blanketly formed, deposited, or grown on the surface of the IC die. Concluding the present example and as shown at 448, a third layer of oxide material 450 is deposited by the deposition tool 106 to the semiconductor wafer 108. As a result of operations of method 300, the oxide material 450 covering the programmable memory device gate area 406 is optimized for the programmable memory device with a first thickness 452 that is thinner than a second, combined thickness 454 of the combined layers of oxide material 456 covering the processor core device gate area 408. This may be effective to provide a programmable memory device with an optimized gate oxide thickness such that a programming voltage of the programmable memory device that is lower than other conventionally implemented memory devices. Thus, programming circuitry associated with the programmable memory device with optimized gate oxide thickness may be implemented to generate and operate with lower on-die voltages. This in turn may reduce the complexity, isolation, and cost of the programming circuitry, thereby enabling IC dies to be implemented at lower cost, with less silicon footprint, and less power consumption. Alternately or additionally, a subsequent fabrication process may form topological asperities at oxide gate interfaces of the programmable memory devices to further optimize the oxide gate of the programmable memory device for a lower programming voltage.

FIG. 5 illustrates an example method 500 for fabricating oxide gates of programmable memory devices that are thicker than other oxide gates of an IC die. The operations can be performed by the lithography tool 102, etch tool 104, and deposition tool 106 of FIG. 1.

At 502, gate areas of programmable memory devices and processor devices of an IC die fabricated on a semiconductor wafer are exposed and gate areas are occluded. In some cases, one or more lithography masks are positioned relative the semiconductor wafer containing the IC die via a mask mechanism or wafer mechanism of a lithography tool. Generally, the semiconductor wafer includes a silicon substrate that is configured to provide respective features of the programmable memory devices, processor devices, and I/O devices for the IC die. The semiconductor wafer may also include a layer of oxide material and a layer of photoresist material over the layer of oxide material. Light or other energy radiated through the lithography mask may interact with exposed portions of the photoresist material, such as over the gate areas of the programmable memory devices and processor devices of the IC die. After being exposed to light or energy, the semiconductor wafer may then be developed to remove portions of photoresist material to enable etching respective portions of the underlying oxide material.

Figure 6:
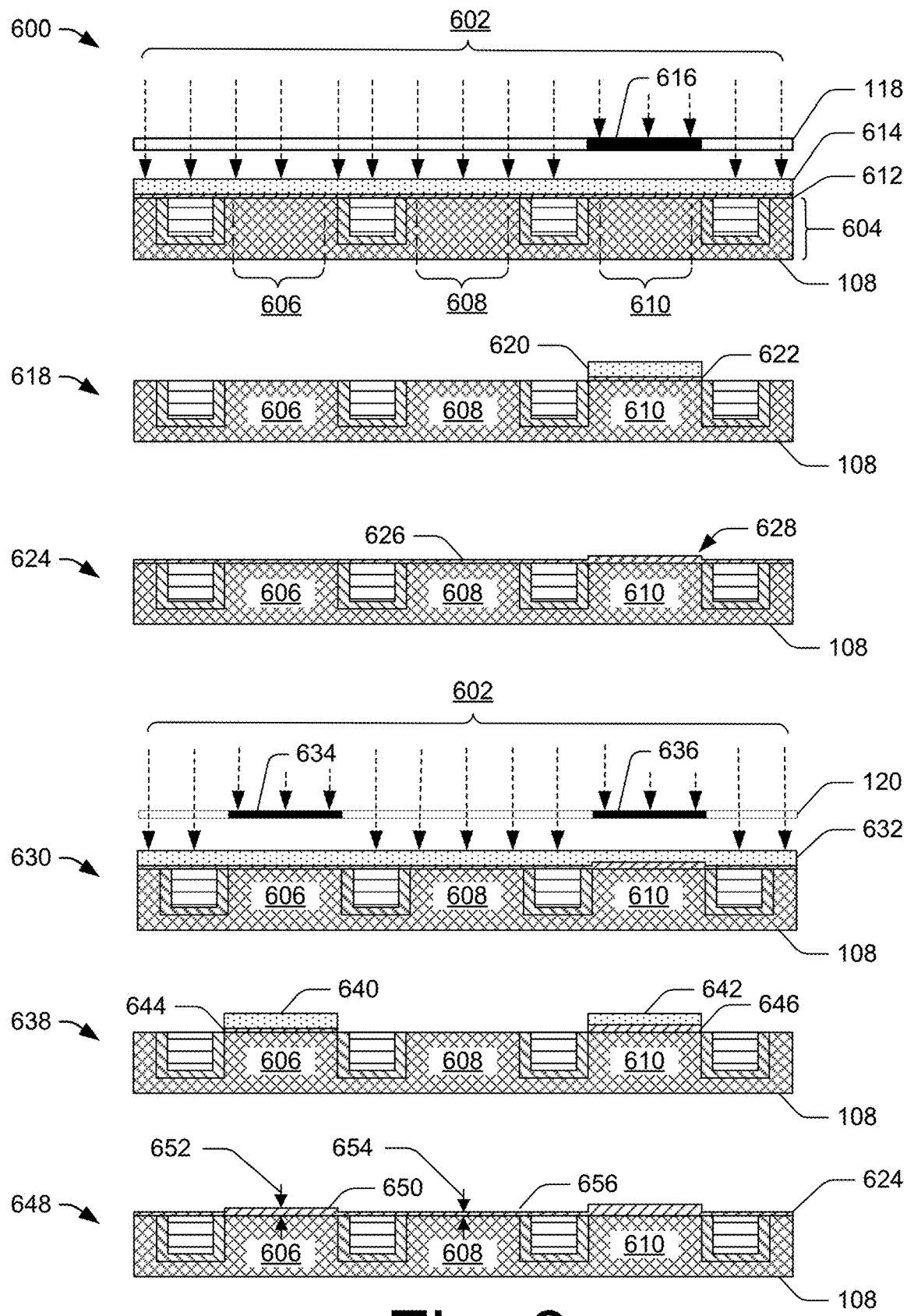
FIG. 6 illustrates example cross sections of an IC die fabricated to provide programmable memory device oxide gates that are thicker than other oxide gates of the IC die.

By way of example, consider FIG. 6, in which a semiconductor wafer is illustrated at various stages of fabrication. As shown at 600, a semiconductor wafer 108 is patterned using light 602 that is radiated from the light source 112 of the lithography tool 102. The semiconductor wafer 108 includes a silicon substrate 604 that is configured via previous fabrication processes to have one or more IC die, each IC die with at least a programmable memory device gate area 606, a processor core device gate area 608, and an I/O device gate area 610. Here, the semiconductor wafer 108 is received with a first layer of an oxide material 612 and a first layer of photoresist material 614. At the lithography tool 102, the semiconductor wafer 108 is positioned relative to the first mask 118. In this example, the first mask 118 is configured to allow the radiated light 602 to radiate through the first mask 118 and interact with portions of the first layer of photoresist material 614 covering at least the programmable memory device gate area 606 and the processor core device gate area 608. The first mask is also configured to prevent, via an opaque section 616, the radiated light 602 from radiating through the first mask 118 to other portions of the first layer of photoresist material 614, such as that covering the I/O device gate area 610.

As shown at 600, the opaque section 616 occludes (e.g., covers or blocks) the I/O device gate area 610 from the light source 112 and prevents the radiated light 602 from interacting with the first layer of photoresist material 614 that covers the I/O device gate area 610. After the semiconductor wafer 108 is patterned via the radiated light 602, the semiconductor wafer 108 is developed by a developing tool (not shown) to remove portions of the first layer of photoresist material 614. In some cases, the first layer of photoresist material 614 is positive in nature and, as the semiconductor wafer 108 is developed, portions of the first layer of photoresist material 614 that interacted with the radiated light 602 are dissolved by a developing solution and removed. In other cases, the first layer of photoresist material 614 is negative in nature and, as the semiconductor wafer is developed, portions of the first layer of photoresist material 614 that did not interact with the radiated light 602 are dissolved by the developing solution and removed. In such cases the pattern of the first mask may be reversed from that shown in FIG. 6 such that the I/O device area 610 is exposed to the radiated light 602.

At 504, a first layer of oxide material is etched from exposed gate areas of the programmable memory devices and processor core devices of the IC die. The oxide material is also etched from other portions of the IC die that are exposed by the removal of the photoresist material. The oxide material can be etched from a semiconductor wafer containing the IC die using any suitable etchant fluid, such as a chemical liquid, plasma gas, and the like. Alternately or additionally, the semiconductor wafer can be presented to an ashing tool after etching, in which instance photoresist remaining on the IC die may be removed.

Continuing the ongoing example and as shown at stage 618, the semiconductor wafer 108 is etched by the etch tool 104 to remove the portions of the first layer of oxide material 612 that were covered by the previously-exposed portions of the first layer of photoresist material 614. Here, stage 618 illustrates a state of the semiconductor wafer 108 that results from the first layer of photoresist material 614 being a positive photoresist material, the exposed portions of which were developed to permit the underlying oxide material to be etched from the surface of the wafer.

In contrast to the developed portions, a portion 620 of the first layer of photoresist material 614 that was not irradiated by the light 602 protects a respective portion 622 of the first layer of oxide material 612 covering the I/O device gate area 610 from being etched off the surface of the semiconductor wafer 108. As such, the portion 622 of the first layer of oxide material 612 remains on the semiconductor wafer 108 to form a base oxide layer over the I/O gate device area 610. After etching the unprotected portions of the first layer of oxide material 612 from the semiconductor wafer 108, an ashing tool removes remaining portions of the first layer of photoresist material 614 that were not irradiated, such as the portion 620 of the first layer of photoresist material 614 covering the I/O gate device area 610.

At 506, a second layer of oxide material covering the gate areas of the programmable memory devices, processor core devices, and I/O devices of the IC die is formed. This second layer of oxide material may be blankety formed, deposited, or grown on the surface of the IC die. In the context of the present example and as shown at 624, a second layer of oxide material 626 is deposited by the deposition tool 106 onto the surface of the semiconductor wafer 108. Here, note that the second layer of oxide material 626 is thicker on the I/O gate device area 610 due to the second layer of oxide material 626 being formed at 628 on the remaining portion 622 of the first layer of oxide material 612.

At 508, gate areas of processor core devices of the IC die are exposed and gate areas of the I/O devices are occluded. In some cases, one or more lithography masks are positioned relative to a semiconductor wafer of the IC die via a mask mechanism or wafer mechanism of a lithography tool. The semiconductor wafer may also include a layer of oxide material and a layer of photoresist material over the oxide material. Light or other energy radiated through the one or more lithography masks may interact with exposed portions of the photoresist material, such as portions over the gate areas of the processor core devices of the IC die. After being exposed to light or energy, the semiconductor wafer may then be developed to remove portions of photoresist material to enable etching of respective portions of the underlying oxide material.

Continuing with the ongoing example and as shown at 630, the semiconductor wafer 108 is patterned with the light 602 radiated from the light source 112 of the lithography tool 102. Here, assume that the semiconductor wafer 108 is received with a second layer of photoresist material 632 that is applied by a coating tool (not shown) between states depicted at 624 and 630. At 630, the second mask 120 is configured to prevent radiated light 602 from radiating through opaque areas 634 and 636. The radiated light 602 interacts with portions of the second layer of photoresist material 632 covering the processor core device gate area 608 and does not interact with portions of the second layer of photoresist material 632 covering the programmable memory device gate area 606 or the I/O device gate area 610.

After stage 630, the semiconductor wafer 108 is developed on a developing tool (not shown) to remove portions of the second layer of photoresist material 632. In some cases, the second layer of photoresist material 632 is positive in nature and, as the semiconductor wafer 108 is developed, portions of the second layer of photoresist material 632 that interacted with the radiated light 602 are dissolved by a developing solution and removed. In other cases, the second layer of photoresist material 632 is negative in nature and, as the semiconductor wafer 108 is developed, portions of the second layer of photoresist material 632 that did not interact with the radiated light 602 are dissolved by the developing solution and removed. In such cases, the pattern of the second mask 120 may be reversed from that shown in FIG. 6 such that portions of the second layer of photoresist material 632 covering the programmable memory gate area 606 and the I/O device gate area 610 are exposed to the radiated light 602.

At 510, the second layer of oxide material is etched from the exposed gate areas of the processor core devices of the IC die. The second layer of the oxide material is also etched from other portions of the IC die that are exposed by the removal of the second layer of photoresist material. Generally, oxide material can be etched from a semiconductor wafer containing the IC die using any suitable etchant fluid, such as a chemical liquid, plasma gas, and the like. Alternately or additionally, the semiconductor wafer can be presented to an ashing tool after etching, in which instance photoresist remaining on the IC die may be removed.

In the context of the present example and as shown at 638, the semiconductor wafer 108 is etched by the etch tool 104. During etching at 638, the processor core device gate area 608 is exposed while the programmable memory device gate area 606 and the I/O device gate area 610 are protected from the etching by respective portions 640, 642 of the second layer of photoresist material 632. Here, 638 illustrates a state of the semiconductor wafer that results from the second layer of photoresist material 632 being a positive photoresist material, the exposed portions of which were developed to permit the underlying oxide material to be etched from the surface of the wafer.

In contrast to the developed portions, portions 640, 642 of the second layer of photoresist material 632 that were not irradiated by the light 602 protect respective portions 644, 646 of the layers of oxide material covering the programmable memory device gate area 606 and I/O device gate area 610 from being etched off the semiconductor wafer 108. As such, these portions 644, 646 of the oxide material remain on the semiconductor wafer 108 to form, or increase a thickness of, oxide layers over the programmable memory device gate area 606 and the I/O device gate area 610. After etching the unprotected portions of the second layer of oxide material 626 from the semiconductor wafer 108, an ashing tool removes remaining portions of the second layer of photoresist material 632 that were not irradiated, such as the portions 640, 642 of the second layer of photoresist material 632.

At 512, a third layer of oxide material covering the respective gate areas of the programmable memory devices, processor core devices, and I/O devices of the IC die is formed. This third layer of oxide material may be blanketly formed, deposited, or grown on the surface of the IC die. Concluding the present example and as shown at 648, a third layer of oxide material 624 is deposited by the deposition tool 106 to the semiconductor wafer 108. As a result of operations of method 500, the combined layers of oxide material 650 covering the programmable memory device gate area 606 is optimized for the programmable memory device with a first, combined thickness 652 that is thicker than a second thickness 654 of the layer of oxide material 624 covering the processor core device gate area 608. This may be effective to provide a programmable memory device with an optimized gate oxide thickness such that transistor gate leakage is reduced and reliability of the programmable memory device is improved. Alternately or additionally, a subsequent fabrication process may form topological asperities at oxide gate interfaces of the programmable memory devices to further optimize the oxide gate of the programmable memory device for a lower programming voltage.

System-on-Chip

Figure 7:
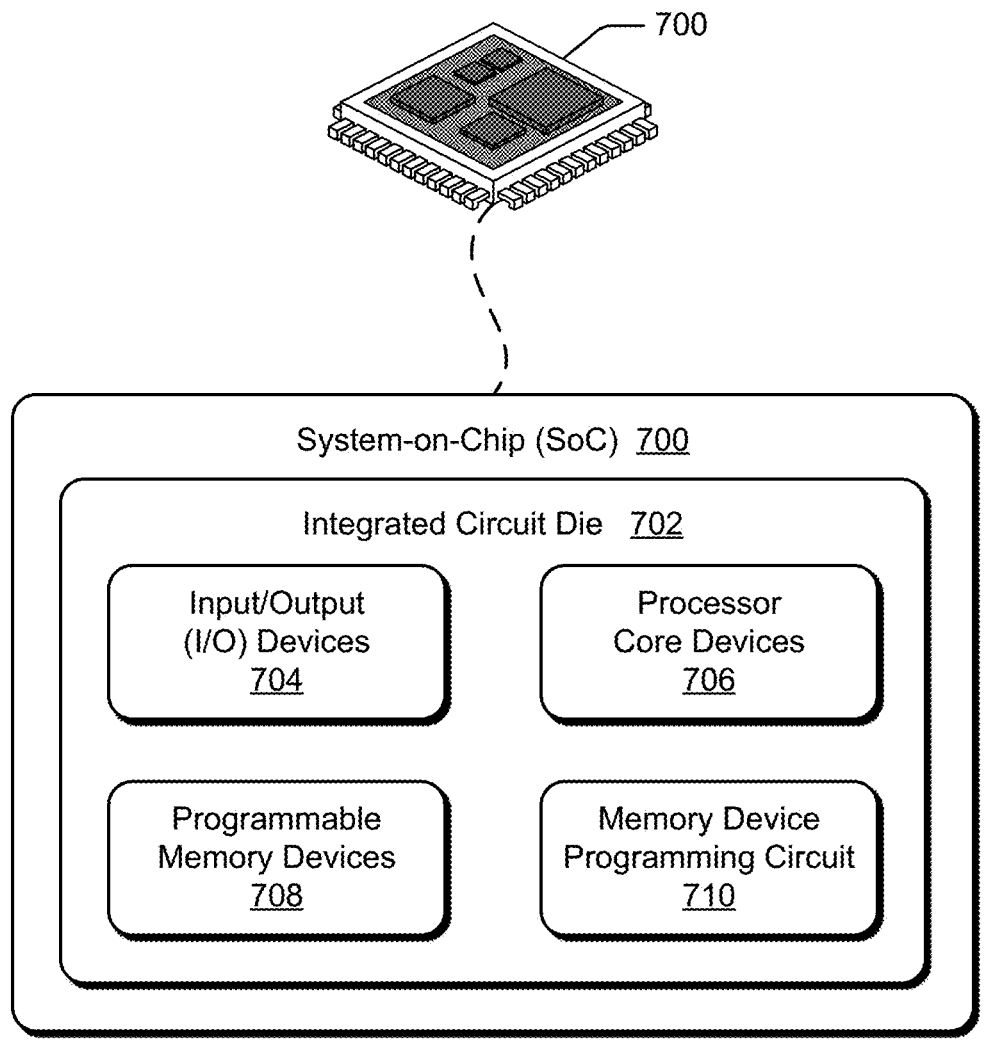
FIG. 7 illustrates an example SoC component that includes multiple types of IC devices.

FIG. 7 illustrates an exemplary System-on-Chip (SoC) 700 that is implemented with an integrated-circuit (IC) die 702 having devices that may be provided in accordance with various aspects described herein. The SoC 700 can be implemented in any suitable device, such as a smart-phone, cellular phone, netbook, tablet computer, server, wireless router, network-attached storage, camera, smart appliance, printer, a set-top box, or any other suitable type of device. Although described with reference to a SoC, the IC die 702 may also be implemented in a network interface controller (NIC), system-in-package (SIP), application-specific standard part (ASSP), digital signal processor (DSP), programmable SoC (PSoC), or field-programmable gate array (FPGA).

In this example, the IC die 702 includes transistors that are configured as multiple types of devices through which respective functionalities of the SoC 700 can be implemented. The device types of the IC die 702 include input-output (I/O) devices 704, processor core devices 706, and programmable memory device 708. The I/O devices 704 may be implemented as I/O circuitry, such as digital or analog interfaces to entities external to the SoC 700. The processor devices 706 of the IC die 702 may be configured as a microprocessor of the SoC 700 (e.g., any of a microcontroller, processor core, application processor, or DSP) for executing processor-executable instructions from storage media (not shown) on which the instructions and other information are embodied.

The programmable memory devices 708 of the IC die 700 may be configured as any suitable type of programmable or non-volatile memory, such as one-time programmable (OTP) memory or multiple-time programmable (MTP) memory. In some cases, the programmable memory is configured as electronic anti-fuse memory in which bits of memory cells are set by breaking down an oxide gate of a memory cell transistor effective to provide a low impedance path or "short" through the memory cell. By so doing, a value of the memory cell can be set to a "1" or "0" depending on a bit value convention of the programmable memory devices. To program the programmable memory devices 708, the IC die 702 includes a memory device programming circuit 710 to store bits or values to the programmable memory devices 708.

In some aspects, the memory device programming circuit 710 is configured to apply, based on bit address information, a programming voltage to an oxide gate of a corresponding programmable memory device 708 such that the oxide gate of the transistor is physically altered. This may include altering the oxide gate effective to provide a low impedance path or "short" through the transistor. By so doing, the bit value at the address is programmed for subsequent reading via sense circuitry (not shown) and the bit value of the programmable memory device 708 is retained in a persistent state without a need for power to refresh or maintain the memory cell (e.g., non-volatile).

As described herein, the oxide gate of the programmable memory device 708 can be fabricated at a thickness optimized for a specific programming voltage in relation to operating voltages of other devices on the IC die 702. For example, the transistor of the programmable memory device 708 can be fabricated with an optimized gate oxide thickness that is thinner than that of other devices of the IC 702. By so doing, a programming voltage of the programmable memory device with optimized gate oxide thickness may be reduced compared to a programming voltage of a conventionally implemented programmable memory device. In some cases, the programming voltage of the programmable memory device is approximately twice a voltage at which the core processor devices 702 operate. In contrast, a programming voltage of a conventional programmable memory device may be four to five times an operating voltage of a processor device having a same gate oxide thickness. As such, the memory device programming circuit 710 can be implemented to generate and operate with lower on-die voltages, which allows the programming circuit to be implemented with less isolation, reduced complexity, and in a smaller design space than those associated with conventional (e.g., higher voltage) programmable memories.

The devices of the IC die 702, either independently or in combination with other entities of the SoC 700, can be implemented with any suitable combination of semiconductor features or circuitry to implement various aspects and/or features of entities or devices described herein. The IC die 702 may also be provided integral with other entities of the SoC 700, such as integrated with an I/O logic interface, a memory controller, or non-volatile memory of the SoC 700. Alternately or additionally, the IC die 702 and the devices thereof can be implemented as hardware, firmware, fixed logic circuitry, or any combination thereof.

Further aspects of the present disclosure relate to one or more of the following clauses.

A method includes exposing respective gate areas of programmable memory devices and processor core devices of an integrated-circuit (IC) die and occluding gate areas of input/output (I/O) devices of the IC die. A first layer of material is etched from the exposed respective gate areas of the programmable memory devices and the processor core devices. A second layer of oxide material is formed on the IC die, coating the respective gate areas of the programmable memory devices, the processor core devices, and the I/O devices. The gate areas of the programmable memory devices are exposed and the respective gate areas of the processor core devices and the I/O devices are occluded. The second layer of oxide material is etched from the exposed gate areas of the programmable memory device. A third layer of oxide material is formed on the IC die, coating the respective gate areas of the programmable memory devices, the processor core devices, and the I/O devices of the IC die.

In the method, a thickness of the third layer of oxide material on the gate areas of the programmable memory devices is less than a combined thickness of the second and third layers of oxide material on the gate areas of the processor core devices.

In the method, exposing the respective gate areas of the processor core devices and programmable memory devices of the IC die and occluding gate areas of I/O devices of the IC die comprises depositing a photoresist material, radiating light through the one or more lithography masks, and developing the photoresist material.

In the method, the photoresist material is a positive photoresist material.

In the method, forming of the first layer of oxide material, the second layer of oxide material, or the third layer of oxide material forms a layer of silicon oxynitride material, a layer of silicon dioxide material, or a layer of silicon nitride material.

In the method, the first, the second, or the third layer of oxide material is formed via chemical vapor deposition across the IC die.

The method may further comprise forming topographical asperities in the third layer of oxide material at oxide-gate interfaces of the programmable memory devices.

Another method includes exposing respective gate areas of programmable memory devices and processor core devices of an integrated-circuit (IC) die and occluding gate areas of input/output (I/O) devices of the IC die. A first layer of oxide material is etched from the exposed respective gate areas of the programmable memory devices and the processor core devices. A second layer of oxide material is formed on the IC die, coating the respective gate areas of the programmable memory devices, the processor core devices, and the I/O devices. Gate areas of the processor core devices are exposed and respective gate areas of the programmable memory devices and the I/O devices are occluded. The second layer of material is etched from the exposed gate areas of the processor core devices. A third layer of oxide material is formed on the IC die, the third layer of oxide material coating the respective gate areas of the programmable memory devices, the processor core devices, and the I/O devices of the IC die.

In the method, a thickness of the third layer of oxide material on the gate areas of the programmable memory devices is greater than a combined thickness of the second and third layers of oxide material on the gate areas of the processor core devices.

In the method, exposing the gate areas of the processor core devices and occluding the respective gate areas of the programmable memory devices and the I/O devices comprises deposition of a photoresist material, radiation of light through one or more lithography masks, and developing the photoresist material.

In the method, the photoresist material is a positive photoresist material.

In the method, forming of the first layer of oxide material, the second layer of oxide material, or the third layer of oxide material forms a layer of silicon oxynitride material, a layer of silicon dioxide material, or a layer of silicon nitride material.

In the method, the first layer of oxide material, the second layer of oxide material, or the third layer of oxide material is formed via chemical vapor deposition across the IC die.

The method may also include forming topographical asperities in the third layer of oxide material at oxide-gate interfaces of the programmable memory devices.

An integrated-circuit (IC) die comprises input/output (I/O) devices having oxide gates of a first thickness and core processor devices having oxide gates of a second thickness, the second thickness of the oxide gates of the core processor devices being different from the first thickness of the oxide gates of the I/O devices. Also included are non-volatile programmable memory devices having oxide gates of a third thickness, the third thickness of the oxide gates of the non-volatile programmable memory devices being different from the second thickness of oxide gates of the core processor devices and the first thickness of oxide gates of the I/O devices. The IC die also includes memory device programming circuit configured to program the non-volatile memory devices by altering respective oxide gates of the non-volatile memory devices using a programming voltage that is approximately twice a voltage at which the processor core devices operate.

In the IC die, the third thickness of oxide gates of the non-volatile programmable memory devices is thinner than the second thickness of the oxide gates of the processor devices or is thicker than the second thickness of the oxide gates of the core processor devices.

In the IC die, the non-volatile programmable memory devices are configured as one-time programmable (OTP) or multiple-time programmable (MTP) memory devices.

In the IC die, the memory device programming circuit configured to program the non-volatile memory devices programs the non-volatile memory devices based on bit address information.

In the IC die, the oxide gates of the I/O devices, the oxide gates of the core processor devices, and the oxide gates of the non-volatile programmable memory devices are formed using a layer of silicon oxynitride material, a layer of silicon dioxide material, or a layer of silicon nitride material.

Although the subject matter has been described in language specific to structural features and/or methodological operations, it is to be understood that the subject matter defined in the appended claims is not necessarily limited to the specific features or operations described herein, including orders in which they are performed.

What is claimed is:

1. An integrated-circuit (IC) die comprising:
   input/output (I/O) devices having oxide gates of a first thickness;
   core processor devices having oxide gates of a second thickness, the second thickness of the oxide gates of the core processor devices being different from the first thickness of the oxide gates of the I/O devices; and
   non-volatile programmable memory devices having oxide gates of a third thickness, the third thickness of the oxide gates of the non-volatile programmable memory devices being:
   (i) thinner than the second thickness of oxide gates of the core processor devices of the IC die; and
   (ii) different from the first thickness of oxide gates of the I/O devices of the IC die.

2. The IC die of claim 1, wherein the non-volatile programmable memory devices are one-time programmable (OTP) memory devices.

3. The IC die of claim 2, wherein the one-time (OTP) programmable memory devices are configured as electronic anti-fuse memory devices.

4. The IC die of claim 1, wherein the non-volatile programmable memory devices are multiple-time programmable (MTP) memory devices.

5. The IC die of claim 1, further comprising a memory device programming circuit configured to program the non-volatile programmable memory devices by altering respective oxide gates of the non-volatile programmable memory devices using a programming voltage.

6. The IC die of claim 5, wherein the programming voltage used by the memory device programming circuit is approximately twice a voltage at which the processor core devices operate.

7. The IC die of claim 5, wherein the memory device programming circuit configured to program the non-volatile programmable memory devices programs the non-volatile memory devices based on bit address information or bit value information.

8. The IC die of claim 1, wherein the oxide gates of the I/O devices, the oxide gates of the core processor devices, or the oxide gates of the non-volatile programmable memory devices are formed with a silicon oxynitride material.

9. The IC die of claim 1, wherein the oxide gates of the I/O devices, the oxide gates of the core processor devices, or the oxide gates of the non-volatile programmable memory devices are formed with a silicon dioxide material.

10. The IC die of claim 1, wherein the oxide gates of the I/O devices, the oxide gates of the core processor devices, or the oxide gates of the non-volatile programmable memory devices are formed with a silicon nitride material.

11. The IC die of claim 1, wherein the oxide gates of the non-volatile programmable memory devices include topographical asperities.

12. A System-on-Chip comprising:
core processor devices having oxide gates of a first thickness;
non-volatile programmable memory devices having oxide gates of a second thickness, the second thickness of the oxide gates of the non-volatile programmable memory devices being thinner than the first thickness of oxide gates of the core processor devices; and
a memory device programming circuit configured to program the non-volatile memory devices by altering respective oxide gates of the non-volatile memory devices using a programming voltage.

13. The System-on-Chip of claim 12, wherein the non-volatile programmable memory devices of the System-on-Chip are one-time programmable (OTP) memory devices.

14. The System-on-Chip of claim 13, wherein the OTP programmable memory devices of the System-on-Chip are configured as electronic anti-fuse memory devices.

15. The System-on-Chip of claim 12, wherein the non-volatile programmable memory devices of the System-on-Chip are multiple-time programmable (MTP) memory devices.

16. The System-on-Chip of claim 12, further comprising input/output (I/O) devices having oxide gates of a third thickness that is different from the second thickness of the oxide gates of the non-volatile programmable memory devices.

17. The System-on-Chip of claim 12, wherein the oxide gates of the non-volatile programmable memory devices are formed with one of a silicon oxynitride material, a silicon dioxide material, or a silicon nitride material.

18. A method performed by an integrated-circuit (IC) die, the method comprising:
operating, by a processor of the IC die, processor core devices of the IC die at a first voltage, the processor core devices having oxide gates of a first thickness; and
programming, by a memory device programming circuit of the IC die, non-volatile programmable memory devices of the IC die at a second voltage, wherein:
the non-volatile programmable memory devices have oxide gates of a second thickness that is thinner than the first thickness of the oxide gates of the processor core devices, and
the second voltage for programming the non-volatile programmable memory devices is approximately twice the first voltage at which the processor core devices operate.

19. The method of claim 18, wherein programming the non-volatile programmable memory devices comprises setting respective bit values of the non-volatile programmable memory devices.

20. The method of claim 18, further comprising operating input/output (I/O) devices of the IC die, the I/O devices having oxide gates of a third thickness that is different from the second thickness of the oxide gates of the non-volatile programmable memory devices.

* * * * *